United States Patent [19]

Lane

[11] Patent Number: 4,746,623

[45] Date of Patent: May 24, 1988

[54] METHOD OF MAKING BIPOLAR SEMICONDUCTOR DEVICE WITH WALL SPACER

[75] Inventor: Richard H. Lane, San Jose, Calif.

[73] Assignee: Signetics Corporation, Sunnyvale, Calif.

[21] Appl. No.: 809,653

[22] Filed: Jan. 29, 1986

[51] Int. Cl.[4] ................... H01L 21/265; H01L 21/283
[52] U.S. Cl. ........................................ 437/28; 156/643;
156/649; 156/653; 156/657; 357/34; 357/54;
357/56; 357/91; 437/33; 437/38; 437/69;
437/193; 437/200; 437/228; 437/909; 437/931;
437/956; 437/984
[58] Field of Search ........ 148/174, 175, 1.5, DIG. 19,
148/DIG. 145; 29/576 E, 576 B, 576 W, 578,
580, 590, 591; 156/653, 657, 643, 649; 357/34,
54, 56, 59; 437/33, 38, 28, 69, 193, 200, 228,
909, 931, 956, 984

[56] References Cited

U.S. PATENT DOCUMENTS 3,730,778  5/1973  Shannon et al. .................. 148/1.5
4,330,931  5/1982  Liu .............................. 148/DIG. 147

FOREIGN PATENT DOCUMENTS 2081507  2/1982  United Kingdom .

OTHER PUBLICATIONS

Maheux, L., "Transistor for Monolithic Circuits", I.B.M. Tech. Discl. Bull., vol. 11, No. 12, 1969, pp. 1690-1691.

Primary Examiner—William G. Saba
Attorney, Agent, or Firm—Robert T. Mayer

[57] ABSTRACT

A method for fabricating a semiconductor device in which the base resistance is minimized to increase the speed of operation of the device. This is accomplished because the device made by the method makes it possible to form the base and emitter contacts next to each other laterally but spaced vertically.

9 Claims, 3 Drawing Sheets

METHOD OF MAKING BIPOLAR SEMICONDUCTOR DEVICE WITH WALL SPACER

This is an invention in semiconductor technology.

Semiconductor manufacturers are continually striving to increase the density of devices on integrated circuits. Increased density, however, is not acceptable if gained by sacrificing performance. This invention involves an improved process for fabricating bipolar transistors. It not only increases density but also produces faster operating transistors.

It is an object of the invention to minimize the spacing between the base contact and the emitter contact of a bipolar transistor.

One of the features of the invention is the use of an oxide spacer to separate the base silicide layer of a transistor from its emitter silicide layer whereby those layers can be vertically separated and laterally next to each other.

One of the advantages of the invention is that bipolar transistors can be fabricated with decreased base resistance and thus higher operating speeds.

In accordance with the invention there is provided a method of fabricating a semiconductor device on a semiconductor substrate of a first conductivity type. The method includes providing a region of a second conductivity type on said substrate. An epitaxial layer of the second conductivity type is grown on the region. This layer is separated into isolated zones. A mesa is formed on a selected zone and insulating material is used to cover that portion of the selected zone adjacent the mesa. A first doping is made to the mesa to change its conductivity to the first type. This doping extends below the mesa and into its associated adjacent zone under the insulating material for a predetermined distance. Further doping is made to the mesa to change its conductivity back to the second type. This further doping extends under the insulating material a distance less than the predetermined distance. A conducting layer is then deposited covering the mesa and a portion of the insulating material. The conducting layer and the insulating material is then etched to expose part of the adjacent zone of the first conductivity type while leaving insulating material between the adjacent region of the first conductivity type and the conducting layer.

Other objects, features and advantages will become apparent to those skilled in the art from the following description when considered in conjunction with the appended claims and drawing, in which:

Figure 1:
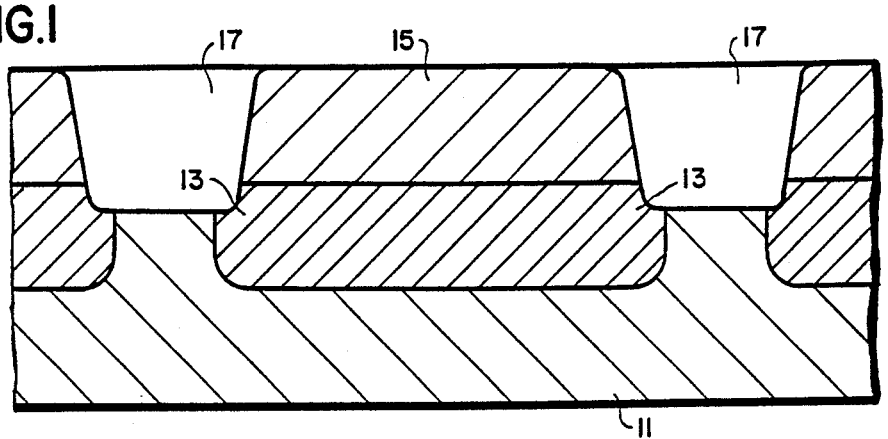
FIG. 1 is a cross-sectional view of a partially fabricated oxide isolated bipolar transistor made in accordance with the present invention.

The drawing is purely schematic and not to scale. This is especially true with respect to the thicknesses and shapes of the elements of the structure shown. Semiconductor regions of the same conductivity type are cross-hatched in the same direction.

Referring to FIG. 1 there is shown a portion of a partially fabricated integrated circuit structure. A monocrystalline silicon semiconductor wafer 11 has been provided with buried regions, such as region 13. An epitaxial silicon layer overlies substrate 11 and the buried regions, such as region 13. The epitaxial layer is divided into separate, isolated zones such as zone 15. This separation is provided by silicon dioxide regions 17. A wafer fabricated in accordance with the invention would contain a large plurality of zones such as 15. Only one will be referred to hereinafter since one zone is sufficient to disclose the invention.

As those skilled in the art will understanding, in most applications substrate 11 is a p-type conductivity semiconductor material and region 13 and zone 15 are n-type conductivity semiconductor material.

Figure 2:
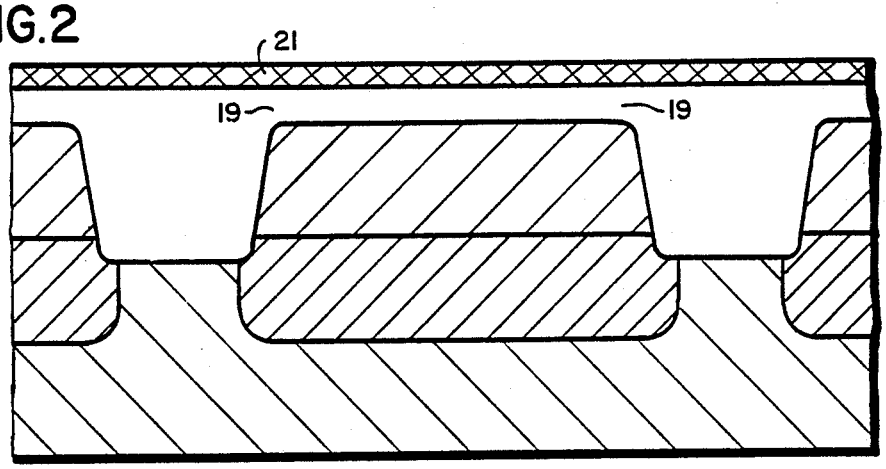
FIG. 2 is a cross-sectional view of the partially fabricated bipolar transistor of FIG. 1 at a later stage of fabrication.

As shown in FIG. 2, during further fabrication of the structure it is subjected to an oxidizing environment which causes an oxide layer 19 to grow on top of region 15. During this process silicon dioxide regions 17 also grows upwardly as is shown. Silicon nitride film 21 is then deposited on top of the oxide.

Figure 3:
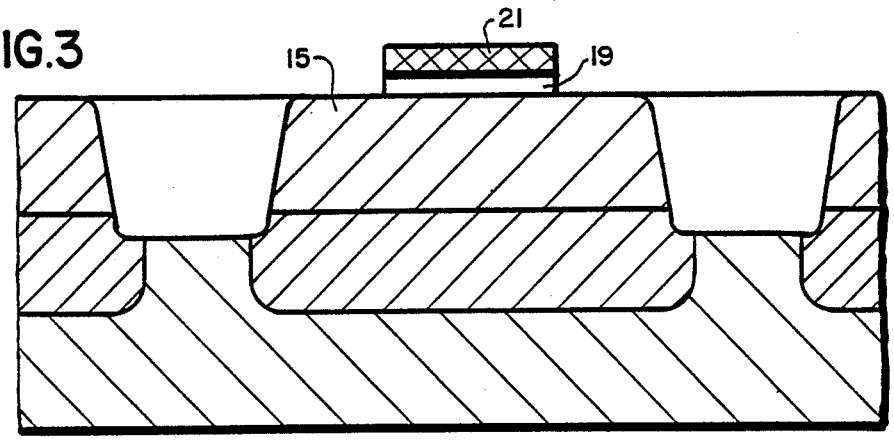
FIG. 3 is a cross-sectional view of the partially fabricated bipolar transistor of FIG. 1 at a still later stage of fabrication.
Figure 4:
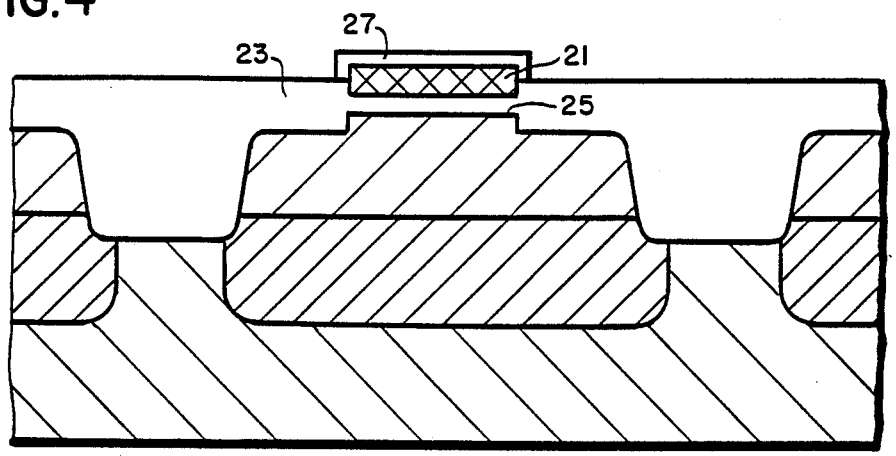
FIG. 4 is a cross-sectional view of the partially fabricated bipolar transistor of FIG. 1 at a still later stage of fabrication.

A photoresist layer (not shown) is formed on nitride film 21. This layer is fabricated into a mask so film 21 and oxide layer 19 can both be etched. Upon such etching and the removal of the photoresist mask, the structure shown in FIG. 3 is produced. This structure is then placed in an oxidizing environment. This causes the silicon in the exposed portion of region 15 to oxidize and form oxide layer 23 (FIG. 4) that merges with regions 17 and layer 19 (FIG. 3) lying under nitride film 21. Film 21 largely prevents the silicon underlying it from being oxidized so as to leave mesa 25. During the oxidation, the oxide layer 27 grows on nitride film 21.

Figure 5:
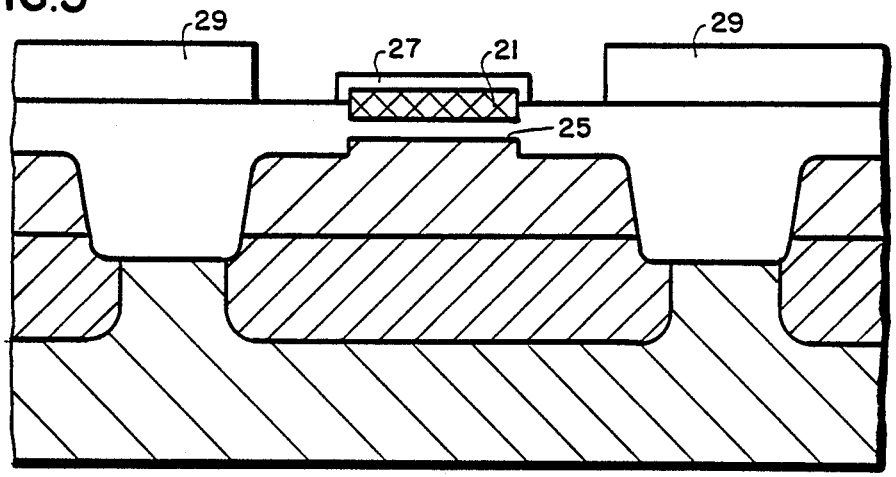
FIG. 5 is a cross-sectional view of the partially fabricated bipolar transistor of FIG. 1 at a still later stage of fabrication.

Subsequently, another photoresist layer 29 (FIG. 5) is formed as a mask against boron implantation. Ion implantation of boron is performed to form a p-type conductivity base area in zone 15. Silicon nitride 21 over the mesa causes the implantation to proceed more rapidly in the portions of region 15 next to the mesa than in the mesa. After that formation photoresist mask 29 is stripped and an oxide etch is performed to expose nitride segment 21. An annealing step is now performed to drive the p-type conductivity area deeper into zone 15 until it appears as area 31 in FIG. 6. The shape of this area is due to the slower doping rate in the mesa than in those portions of region 15 adjacent the mesa. A nitride etch and a further oxide etch produces a semiconductor structure such as is partially shown in FIG. 6.

Figure 6:
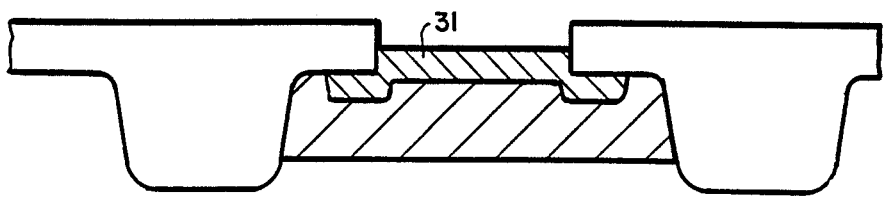
FIG. 6 is a partial cross-sectional view of the partially fabricated bipolar resistor of FIG. 1 at a still later stage of fabrication.
Figure 7:
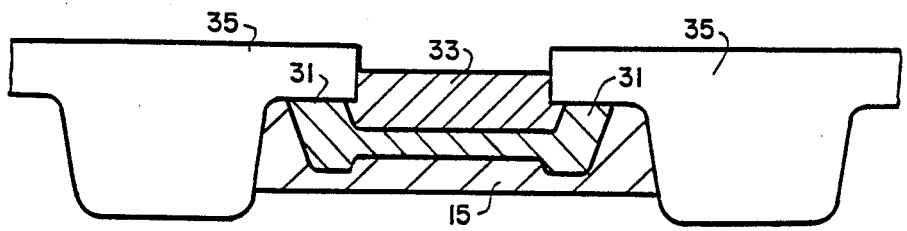
FIG. 7 is a view of the partial section of FIG. 6 at a still later stage of fabrication.
Figure 8:
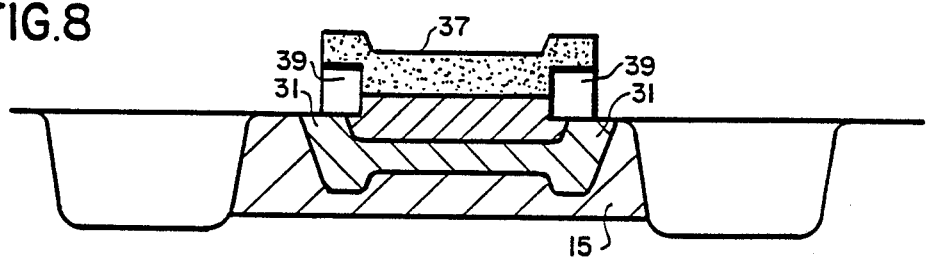
FIG. 8 is a view of the partial section of FIG. 6 at a still later stage of fabrication.

The structure that is partially shown in FIG. 6 is then subjected to an ion implantation of arsenic. This and a subsequent annealing step drives the p-type conductivity base material 31 deeper into region 15 and forms the n-type conductivity emitter 33 (FIG. 7). A polysilicon is then deposited on emitter 33 and oxide regions 35. Another photoresist layer is then deposited on top of the polysilicon to serve as a mask for etching both the polysilicon and the oxide layers 35 to leave the structure shown in FIG. 8. In that figure the polysilicon forms a cap 37 for emitter 33 and the remnant oxide forms spacers 39 between the polysilicon cap 37 and base 31. As those skilled in the art will understand, silicide layers can then be formed on the surfaces of the structure. Contact can then be made to the emitter, base and collector regions of the structure of the example in any well known manner.

From this it can be seen that the base contact and emitter contact can be next to each other laterally but separated vertically by the oxide spacers. As a result the base resistance is decreased and the operating speed is enhanced.

Variations from the example described are contemplated. For example, the entire polysilicon cap could be absorbed in the formation of the silicide whereupon the silicide would be in direct contact with the surface of emitter region 33.

It is understood that various other modifications to the above-described method and device will become evident to those skilled in the art. For that reason the arrangement described herein is for illustrative purposes only and is not to be considered restrictive.

What is claimed is:

1. A method of fabricating a semiconductor device on a semiconductor substrate of a first conductivity type including providing a region of a second conductivity type on said substrate; growing an epitaxial layer of said second conductivity type on said region and separating said layer into isolated zones; forming a mesa on a selected zone; covering a portion of said selected zone adjacent said mesa with insulating material; first doping said mesa by ion implantation to change its conductivity to said first type, said doping extending below said mesa and into said portion of said selected zone adjacent said mesa and under said insulating material a predetermined distance; further doping said mesa by ion implantation to change its conductivity back to said second type, said further doping extending under said insulating material a distance less than said predetermined distance; covering said mesa and a portion of said insulating material with a conducting layer; and etching said conducting layer and said insulating material to expose part of said selected zone of said first conductivity type while leaving insulating material adjacent said mesa and between said conducting layer and said portion of said selected zone of said first conductivity type adjacent said mesa.

2. A method according to claim 1, wherein said mesa is masked during said first doping step which enables said first doping step to proceed more rapidly in said adjacent zones than in said mesa.

3. A method according to claim 2, wherein the masking over said mesa is removed and an annealing step is performed before said further doping step.

4. A method according to claim 2, wherein the masking over said mesa is a layer of silicon nitride.

5. A method according to claim 2, wherein said insulating material is silicon dioxide.

6. A method according to claim 5, wherein said isolated zones are separated by regions of silicon dioxide.

7. A method according to claim 6, wherein said first doping includes an ion implantation of boron.

8. A method according to claim 7, wherein said further doping includes an ion implantation of arsenic.

9. A method according to claim 8, wherein a polysilicon layer is formed on top of said mesa.

* * * * *